United States Patent [19]

Terakawa et al.

[11] Patent Number: 4,857,869
[45] Date of Patent: Aug. 15, 1989

[54] HIGH FREQUENCY PUSH-PULL TRANSFORMER

[75] Inventors: Takashige Terakawa; Noriyuki Akaba; Sadayoshi Hattori, all of Yokohama, Japan

[73] Assignee: Tokyo Keiki Co., Ltd., Tokyo, Japan

[21] Appl. No.: 169,423

[22] Filed: Mar. 17, 1988

[30] Foreign Application Priority Data

Apr. 1, 1987 [JP] Japan .................................. 62-80165

[51] Int. Cl.$^4$ ............................................. H01P 5/10
[52] U.S. Cl. ........................................ 333/26; 330/55; 343/859
[58] Field of Search ...................... 330/53, 54, 55, 165, 330/166, 286, 287; 333/32, 33, 25, 26, 124, 127, 128; 343/859, 860

[56] References Cited

U.S. PATENT DOCUMENTS

| | | | |
|---|---|---|---|
| 2,636,122 | 4/1953 | Hayes | 343/859 X |
| 2,744,167 | 5/1956 | Amy et al. | 330/55 |
| 3,223,939 | 12/1965 | Lawrence, Jr. | 330/55 |
| 3,404,404 | 10/1968 | Theakston | 333/26 X |

OTHER PUBLICATIONS

"Three Balun Designs for Push-Pull Amplifiers", *Microwaves*, vol. 19, No. 7, Jul. 1980, pp. 47-52.

*Primary Examiner*—Steven Mottola
*Attorney, Agent, or Firm*—Sandler & Greenblum

[57] ABSTRACT

This invention relates to a push-pull transformer for use in a high frequency push-pull amplifier. This push-pull transformer has a coaxial line whose one end is connected to an input terminal, while the other end thereof is provided with an internal conductor and an outer conductor, the internal and outer conductors being grounded through stubs. A capacitor having a proper capacity is connected between the internal conductor and the outer conductor whereby the push-pull transformer can be properly actuated in a low frequency range other than the frequency used without any necessity to enlarge the size of the stubs.

12 Claims, 2 Drawing Sheets

HIGH FREQUENCY PUSH-PULL TRANSFORMER

BACKGROUND OF THE INVENTION

1. Filed of the Invention

This invention relates to a high frequency push-pull transformer, and more particularly to a push-pull transformer which is suitable to be used in a high frequency push-pull transformer amplifier.

2. Description of the Prior Art

The major portions of a high frequency push-pull amplifier comprises, as shown in FIG. 3, a high frequency push-pull transformer 10 which is disposed on the input side, an amplifying transistor circuit 20, and a high frequency push-pull transformer 30 which is disposed on the output side.

The high frequency push-pull transformers 10 and 30 which are respectively disposed on the input side and output side have circuits of the same structure. The push-pull transformer 30 on the output side is connected in such a manner as to be disposed inversely with respect to the push-pull transformer 10 on the input side, which means that the input terminal thereof will be disposed inversely with respect to that of the push-pull transformer 10.

A conventional push-pull transformer 10 is shown in FIG. 4, in which reference numeral 11 represents a coaxial input line, reference numeral 11A represents an internal conductor of the coaxial line 11, and reference numeral 11B represents an outer conductor of the coaxial line 11. Stubs 12 and 13 are connected to the internal conductor 11A and the outer conductor 11B, respectively. The length of each of the stubs 12 and 13 is determined in such a manner that they each become quarter-wavelength line with respect to the frequency range for use.

The output from the internal conductor 11A and that from the outer conductor 11B are respectively supplied to output lines 16 and 17 through direct current cutting capacitors 14 and 15, respectively. In this figure, the output lines 16 and 17 are expressed in the form of a microstrip line.

The push-pull transformer 10 shown in FIG. 4 is needed to constitute a high frequency push-pull amplifier, and output terminals 18A and 18B thereof respectively issue outputs of the same amplitude which have a phase difference of 180° from each other. The output from each of the output terminals 18A and 18B is introduced to and amplified by the corresponding transistors or vacuum tubes.

The electric power amplified by the vaccuum tubes or transistors is, as shown in FIG. 3, bound into one by means of the similar push-pull transformer 30. The above components constitute a push-pull amplifier. Reference numeral 10A represents an input terminal.

However, in the above described push-pull transformer 10, the length of each of the stubs 12 and 13 is limited to one quarter of the wavelength of the frequency used. The overall reflection coefficient increases with other frequencies. Therefore, determination of the frequency used determines the size of the stubs 12 and 13. For example, if this circuit is intended to be used in a relatively low frequency range, the size of the stubs 12 and 13 increases, causing the overall size of the high frequency push-pull amplifier which includes these stubs to become large too, which means that handling of the same becomes difficult as well.

SUMMARY OF THE INVENTION

An object of the present invention is therefore to provide a high frequency push-pull transformer in which a slight load is applied to a portion to which the stubs are connected, whereby an effect of lengthening each stub is effectively obtained. As a result of this, the overall size of the mechanical portion of the stubs can be reduced, and the overall size of the high frequency push-pull amplifier can be reduced.

According to the present invention, in order to achieve the above-described objects, a high frequency push-pull transformer is so constituted that it has a coaxial line whose first end is connected to a single input terminal, each internal conductor and outer conductor at the second end of this coaxial line is grounded through a stub having a predetermined length, and each internal conductor and outer conductor is individually connected to corresponding output terminals through respectively provided output lines, the high frequency push-pull transformer comprising reflection absorbing means having a proper capacity which is connected to the internal conductor and the outer conductor at the second end of the above-described coaxial line.

DETAILED DESCRIPTION OF THE PREFERRED EMBODIMENT

Figure 1:
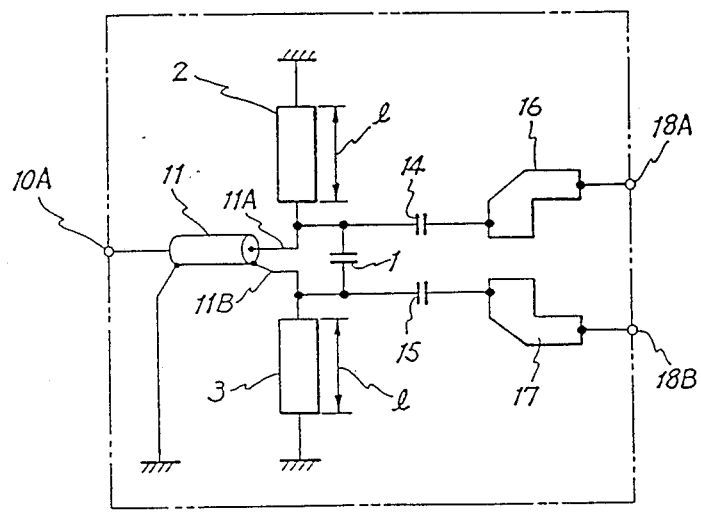
FIG. 1 is a circuit diagram illustrating a first embodiment of the present invention.

An embodiment of the present invention will now be described with reference to FIGS. 1 and 2. Components which are the same as those of the conventional example described above are given the same reference numerals.

Figure 4:
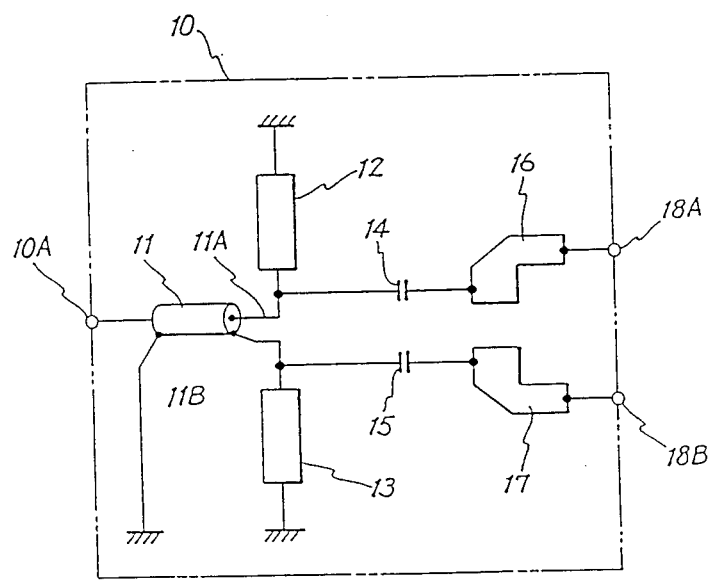

The embodiment shown in FIG. 1 has, similarly to the above-described case shown in FIG. 4, an input coaxial line 11 at the input step thereof. An internal conductor 11A of the coaxial line 11 is connected to an ouput termnal 18A through a direct-current cutting capacitor 14 and an output line 16. Similarly, the outer conductor 11B of the coaxial line 11 is connected to an output terminal 18B through a direct-current cutting capacitor 15 and an output line 17.

A capacitor 1, acting as reflection absorbing means and having a proper capacity, is connected between the internal conductor 11A and the outer conductor 11B. The internal conductor 11A is grounded through a stub 2, while the outer conductor 11B is grounded through a stub 3. The stubs 2 and 3 each have the same length l. This length l is set at a quarter wavelength with respect to the apparent frequency which is determined by the capacity of the capacitor 1 to be described hereinafter. The other parts of the structure are the same as those of the above-described conventional example.

The relationship between the length l of the stubs 2 and 3 and the capacitor 1 will now be described with reference to the results of an experiment.

Figure 2:
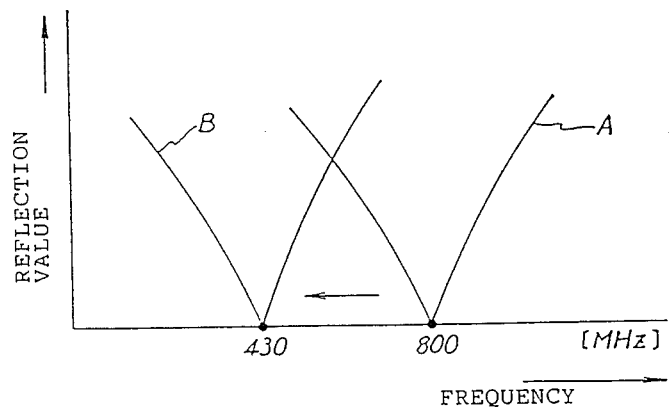
FIG. 2 is a graph explaining in a comparative manner the action of the device shown in FIG. 1.
Figure 3:
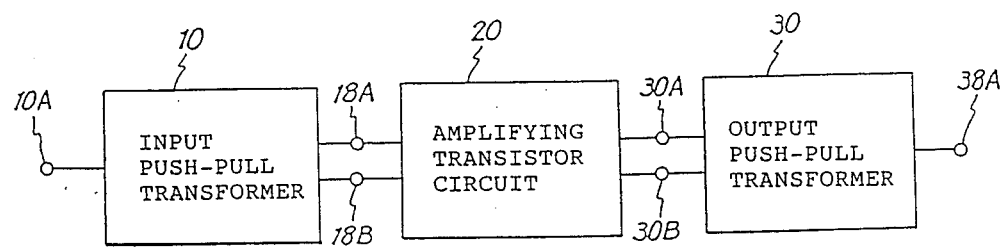
FIGS. 3 and 4 are block diagrams each showing a conventional example.

FIG. 2 illustrates the relationship between the amount of input reflection at the input terminal 10A and the frequency used, the illustration being derived from the results of measurement. Curve A shows a case in which the capacitor 1 shown in FIG. 1 is not used, while curve B shows a case in which the capacitor 1 is used as shown in FIG. 1. That is, in the curve A, the minimum limit of the reflection appears at approximately 800 [MHz], while in the curve B, the same appears at approximately 430 [MHz]. By providing the capacitor 1, the stubs 2 and 3 having the length l which is suitable for 800 [MHz] become suitable for 430 [MHz]. As a result of this, in order to be used for 430 [MHz], the length of each of the stubs 2 and 3 needs to be substantially 2 l, but the length l is sufficient in this case. Therefore, the length of each of the stubs 2 and 3 can be substantially halved by adding the capacitor 1 as shown in FIG. 1.

Although a case according to this embodiment is illustrated in which one capacitor 1 is provided between the internal conductor 11A and the outer conductor 11B, this invention is not limited to this disclosure, and the internal conductor 11A and the outer conductor 11B may be respectively provided with a capacitor. However, in the embodiment described above, an advantage can be obtained in terms of the face that the structure is simple and a compact circuit can be realized.

Furthermore, it is possible for some means other than the capacitor to be employed as the reflection absorbing means.

Since the present invention is constituted to function as described above, the length of the stubs can be significantly shortened by the actuation of the capacitor which is connected between the internal conductor and the outer conductor. As a result of this, a high frequency push-pull transformer with a compact overall size and the handling of which is easy can be provided. Consequently, a high frequency push-pull amplifier in which occurrence of reflection is significantly reduced and with a compact size can be obtained by using the high frequency push-pull transformer according to the present invention.

What is claimed is:

1. A high frequency push-pull transformer comprising a coaxial line having an internal conductor and an outer conductor, a first end of said coaxial line being connected to a single input terminal, said internal conductor and said outer conductor at a second end of said coaxial line are respectively grounded through corresponding stubs, each stub having a predetermined length, said internal and outer conductors also being connected to two output terminals through corresponding output lines, and a reflection absorbing means having a proper capacity which is disposed between said internal conductor and said outer conductor at said second end of said coaxial line.

2. A high frequency push-pull transformer according to claim 1, wherein said reflection absorbing means comprises a capacitor.

3. A high frequency push-pull transformer according to claim 1, wherein said reflection absorbing means comprises at least one capacitor disposed between said internal conductor and said outer conductor.

4. A high frequency push-pull amplifier including:
a first high frequency push-pull transformer which has a coaxial line whose first end is connected to a single input terminal, and in which an internal conductor and an outer conductor at a second end of said coaxial line are respectively grounded through corresponding stubs each having a predetermined length, and in which said internal conductor and outer conductor are respectively connected to two output terminals respectively through corresponding output lines which are provided individually;
an amplifier which is connected to two output terminals of said first push-pull transformer, said amplifier having an output side; and
a second push-pull transformer which is connected to the output side of said amplifier, and which has substantially the same structure as that of the first push-pull transformer, said high frequency push-pull transformer amplifier comprising:
reflection absorbing means connected to said internal conductor and said outer conductor of said first and second push-pull transformers.

5. A high frequency push-pull amplifier according to claim 4, wherein said reflection absorbing means comprises a capacitor.

6. A high frequency push-pull amplifier according to claim 4, wherein said relfection absorbing means comprises at least one capacitor disposed between said internal conductor and said outer conductor.

7. A high frequency push-pull transformer comprising:
at least one input terminal;
at least two output terminals;
a first stub;
a second stub;
a coaxial line, said coaxial line having a first end and a second end, said coaxial line further having an internal conductor and an outer conductor, said internal conductor of said coaxial line at its first end being electrically connected to at least one input terminal, said outer conductor of said coaxial line at its first end being grounded, said internal conductor at its second end being electrically connected to one of said output terminals and ground through said first stub, said outer conductor of said coaxial line at its second end being electrically connected to the other of said output terminals and ground through said second stub; and
reflection absorbing means disposed between said internal conductor and said outer conductor at said second end of said coaxial line.

8. The transformer of claim 7, wherein said reflection absorbing means comprises a capacitor.

9. The transformer of claim 8, wherein said capacitor has a first end and a second end, wherein the first end of said capacitor is connected in circuit between said first stub and said one of said output terminals, and wherein the second end of said capacitor is connected in circuit between said second stub and said other of said output terminals.

10. A high frequency push-pull transformer, comprising:
a first line having a first end and a second end, said first line having a first conductor and a second conductor, said first end of said first line being connected to an input terminal,
a first stub having a predetermined configuration,
a second stub having a predetermined configuration, said first conductor of said second end of said first line being connected to said first stub, said first stub being electrically grounded, said second conductor of said second end of said first end being connected to said second stub, said second stub being electrically grounded,
a first output line,
a second output line, said first conductor of said second end of said first line being connected to said first output line, said second conductor of said second end of said first line being connected to said second output line, said first and second output lines being connected to an amplifying circuit; and a reflection absorbing means connected between said first conductor and said second conductor at said second end of said first line.

11. The transformer of claim 10, wherein said reflection absorbing means comprises a capacitor.

12. The transformer of claim 11, wherein said capacitor has a first end and a second end, said first end of said capacitor being connected between said first stub and said first output line, said second end of said capacitor being connected between said second stub and said second output line.

* * * * *